:::

United States Patent
Iwai et al.

(10) Patent No.: US 11,171,431 B2
(45) Date of Patent: Nov. 9, 2021

(54) COMPONENT INSERTION DEVICE WITH DUMMY COMPONENT, AND COMPONENT INSERTION METHOD AND COMPUTER READABLE RECORDING MEDIUM OF USING THE SAME

(71) Applicant: OMRON Corporation, Kyoto (JP)

(72) Inventors: Yosuke Iwai, Kyoto (JP); Masahiro Murai, Kyoto (JP)

(73) Assignee: OMRON Corporation, Kyoto (JP)

(*) Notice: Subject to any disclaimer, the term of this patent is extended or adjusted under 35 U.S.C. 154(b) by 357 days.

(21) Appl. No.: 16/249,901

(22) Filed: Jan. 17, 2019

(65) Prior Publication Data

US 2019/0280405 A1    Sep. 12, 2019

(30) Foreign Application Priority Data

Mar. 12, 2018 (JP) .............................. JP2018-044533

(51) Int. Cl.
*H01R 12/58* (2011.01)
*H01R 12/89* (2011.01)
(Continued)

(52) U.S. Cl.
CPC ............ *H01R 12/58* (2013.01); *B25J 9/1633* (2013.01); *B25J 9/1687* (2013.01); *B25J 9/1692* (2013.01);
(Continued)

(58) Field of Classification Search
CPC ........ H01R 12/58; H01R 12/89; B25J 9/1633; B25J 9/1687; B25J 9/1692; B25J 19/023;
(Continued)

(56) References Cited

U.S. PATENT DOCUMENTS 6,629,883 B2 * 10/2003 Katsuoka .............. B24B 37/345
                                                    451/332
9,919,421 B2 *  3/2018 Rossano .............. B25J 11/0065
(Continued)

FOREIGN PATENT DOCUMENTS

EP      2644298 A2 * 10/2013 ............ B21J 15/025
JP      S5947129         3/1984
(Continued)

OTHER PUBLICATIONS

"Office Action of Japan Counterpart Application," dated Dec. 1, 2020, with English translation thereof, p. 1-p. 6.
(Continued)

*Primary Examiner* — Peter Dungba Vo
*Assistant Examiner* — Jeffrey T Carley
(74) *Attorney, Agent, or Firm* — JCIPRNET

(57) ABSTRACT

A component insertion device including a robot and a control portion is provided. The control portion is configured to control the operation of the robot. The robot includes a gripper, a dummy component and a force sensor. The gripper is configured for gripping a workpiece component. The dummy component is mounted protruding outward on a location in the gripper and away from the gripped workpiece component. The dummy component has a corresponding part with the same shape as that of a specific part of the workpiece component and exhibits rigidity. The force sensor is configured for detecting, through the gripper, a contact reaction force received by the dummy component from the surrounding of a slot or hole of a receiving portion by which the specific part of the workpiece comment is to be inserted via using the device. Component insertion method and program of using the device are also provided.

6 Claims, 9 Drawing Sheets

(51) Int. Cl.
*H05K 3/36* (2006.01)
*H05K 7/10* (2006.01)
*B25J 9/16* (2006.01)
*B25J 19/02* (2006.01)

(52) U.S. Cl.
CPC .............. *H01R 12/89* (2013.01); *H05K 3/361* (2013.01); *H05K 7/1061* (2013.01); *B25J 19/023* (2013.01); *G05B 2219/39024* (2013.01); *G05B 2219/40028* (2013.01); *G05B 2219/40082* (2013.01)

(58) Field of Classification Search
CPC ................ H05K 3/361; H05K 7/1061; G05B 2219/39024; G05B 2219/40028; G05B 2219/40082
See application file for complete search history.

(56) References Cited

U.S. PATENT DOCUMENTS

| | | | | |
|---|---|---|---|---|
| 2004/0012363 | A1* | 1/2004 | Simondet | B25J 9/1692 318/568.21 |
| 2005/0166413 | A1* | 8/2005 | Crampton | B25J 13/088 33/503 |
| 2007/0059209 | A1* | 3/2007 | Pang | G01N 35/0099 422/72 |
| 2011/0153076 | A1 | 6/2011 | Noro | |
| 2013/0345848 | A1* | 12/2013 | Izumi | B25J 15/0033 700/114 |
| 2014/0114477 | A1* | 4/2014 | Sato | B25J 9/1687 700/250 |
| 2016/0073514 | A1 | 3/2016 | Watanabe | |
| 2016/0111944 | A1* | 4/2016 | Ohshima | H02K 15/03 29/598 |
| 2017/0190053 | A1* | 7/2017 | Xu | B25J 11/0095 |
| 2017/0312921 | A1* | 11/2017 | Kobayashi | B25J 9/1687 |
| 2019/0164799 | A1* | 5/2019 | Liu | B25J 9/1692 |

FOREIGN PATENT DOCUMENTS

| | | |
|---|---|---|
| JP | S63174102 | 7/1988 |
| JP | H04348885 | 12/1992 |
| JP | H1027659 | 1/1998 |
| JP | 2008307634 | 12/2008 |
| WO | 2016186009 | 11/2016 |

OTHER PUBLICATIONS

"Search Report of Europe Counterpart Application", dated Aug. 2, 2019, pp. 1-8.

* cited by examiner

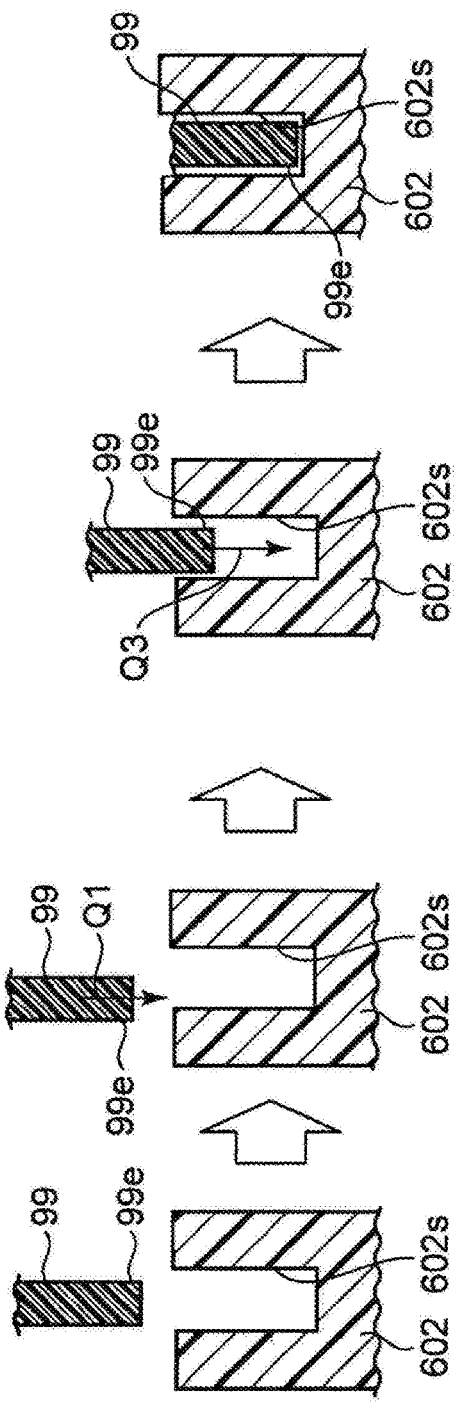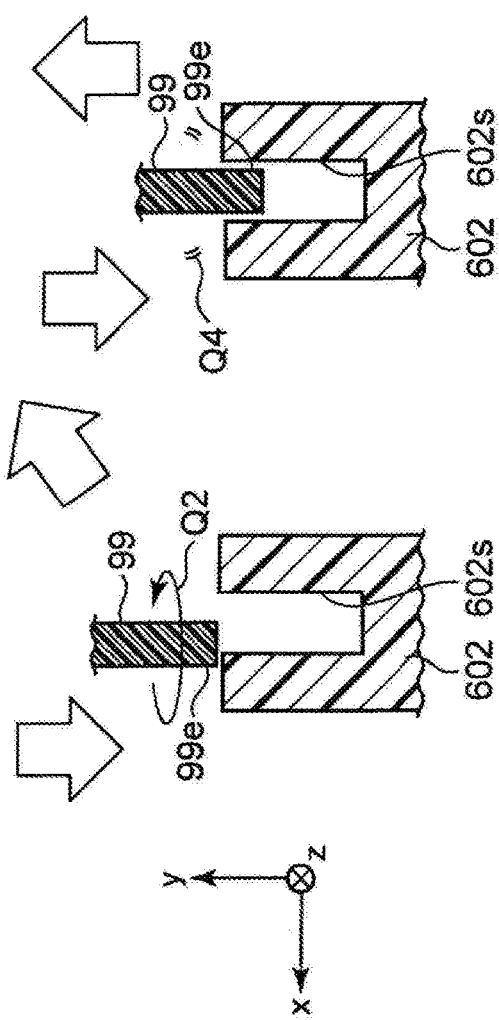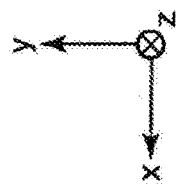

COMPONENT INSERTION DEVICE WITH DUMMY COMPONENT, AND COMPONENT INSERTION METHOD AND COMPUTER READABLE RECORDING MEDIUM OF USING THE SAME

CROSS-REFERENCE TO RELATED APPLICATION

This application claims the priority benefit of Japan Application No. 2018-044533, filed on Mar. 12, 2018. The entirety of the above-mentioned patent application is hereby incorporated by reference herein and made a part of this specification.

BACKGROUND

Technical Field

The present disclosure relates to a component insertion device and a component insertion method, in particular, to a component insertion device and a component insertion method by which a receiving portion having a slot or hole of a certain shape is inserted with a workpiece component that has a shape fitting the slot or the hole. Besides, the present disclosure relates to a program for making a computer execute the component insertion method.

Related Art

A typical case in which a receiving portion having a slot or hole of a certain shape is inserted with a workpiece component that has a shape fitting the slot or the hole may be, for example, the case in which, as disclosed in patent literature 1 (Japanese Laid-Open No. 10-27659), a plate-like FPC (Flexible Printed Circuit) is slid and inserted into a FPC connector having a slender straight-shaped gap (slot).

Conventionally, attempts are made to use, for example, a robot to automatically perform this process (FPC insertion process) of sliding and inserting the FPC into the FPC connector.

LITERATURE OF RELATED ART

Patent Literature

[Patent literature 1] Japanese Laid-Open No. 10-27659

Problem to be Solved

However, the fact is that the FPC insertion process is not mechanized or automatized because of the following reasons.
The first reason to be listed is the difficulty in contact search. Specifically, although it is intended to arrange a force sensor on the robot to make the FPC contact the surrounding (vicinity of the opening) of the slot of the FPC connector and search the position of the slot based on a contact reaction force received by the FPC, the FPC itself may curve due to the contact manner and great plastic deformation occurs. Therefore, it is difficult to search the position of the slot based on the contact reaction force. Moreover, when great plastic deformation occurs in the FPC, the necessity of disposing the FPC arises.
The second reason to be listed is the long duration of a takt time. Specifically, in order to avoid FPC damage (including plastic deformation), it is necessary to push the FPC slowly through compliance control. At this time, the setting of decelerating the pushing speed and decelerating an engagement elimination operation (the operation in which the FPC is slightly vibrated to eliminate the phenomenon that the FPC is caught at an entrance of the slot) is required. As a result, it takes, for example, about 150 seconds to insert one piece of FPC.

Therefore, the present disclosure provides a component insertion device and a component insertion method by which a receiving portion having a slot or a hole of a certain shape can be automatically inserted with a workpiece component which is relatively flexible and has a shape fitting the slot or the hole in a short time. Besides, the present disclosure provides a program for making a computer execute this component insertion method.

SUMMARY

The component insertion device of the disclosure is a component insertion device by which a receiving portion having a slot or a hole of a certain shape is inserted with a specific part of a workpiece component that has a shape fitting the slot or the hole, the component insertion device comprising:
a robot; and
a control portion that controls the operation of the robot;
wherein the robot comprises:
a gripper capable of gripping the workpiece component in a state that the specific part protrudes outward;
a dummy component that is mounted protruding outward on a location in the gripper and away from the gripped workpiece component, has a corresponding part with the same shape as the shape of the specific part of the workpiece component and exhibits rigidity; and
a force sensor capable of detecting, through the gripper, a contact reaction force received by the dummy component from the surrounding of the slot or the hole of the receiving portion; and the control portion comprises:
a first insertion processing portion that performs, in a state that the receiving portion is arranged in a movable range of the robot, a processing in which the corresponding part of the dummy component is inserted into the slot or the hole of the receiving portion by the robot through compliance control which is based on output of the force sensor;
a recognition processing portion that performs, in a state that the corresponding part of the dummy component is inserted into the slot or the hole of the receiving portion, a processing in which a position and a posture of the slot or the hole which use the robot as a reference are recognized; and
a second insertion processing portion that performs, in a state of maintaining the arrangement of the receiving portion, a processing in which the outwardly protruding specific part of the workpiece component gripped in the gripper is inserted into the slot or the hole of the receiving portion based on the position and the posture of the slot or the hole which use the robot as a reference by the robot through position control.

The component insertion method of the disclosure is a component insertion method in which a receiving portion having a slot or a hole of a certain shape is inserted with a specific part of a workpiece component that has a shape fitting the slot or the hole by the aforementioned component insertion device, wherein
in a state that the receiving portion is arranged in a movable range of the robot, the gripper of the robot grips the workpiece component in the state that the specific part protrudes outward, and the dummy component is mounted on the location in the gripper and away from the gripped workpiece component and protrudes outward, a processing is performed in which the corresponding part of the dummy component is inserted into the slot or the hole of the receiving portion by the robot through compliance control which is based on the output of the force sensor, in a state that the corresponding part of the dummy component is inserted into the slot or the hole of the receiving portion, a processing is performed in which the position and the posture of the slot or the hole which use the robot as a reference are recognized, and after that, in a state of maintaining the arrangement of the receiving portion, a processing is performed in which the outwardly protruding specific part of the workpiece component gripped in the gripper is inserted into the slot or the hole of the receiving portion by the robot through position control based on the position and the posture of the slot or the hole which use the robot as the reference.

BRIEF DESCRIPTION OF THE DRAWINGS

FIG. 5A-FIG. 5F are diagrams showing the sequence of inserting an end portion of a dummy component into the slot of the FPC connector through compliance control which is based on output of a force sensor.

DESCRIPTION OF THE EMBODIMENTS

Figure 1A:
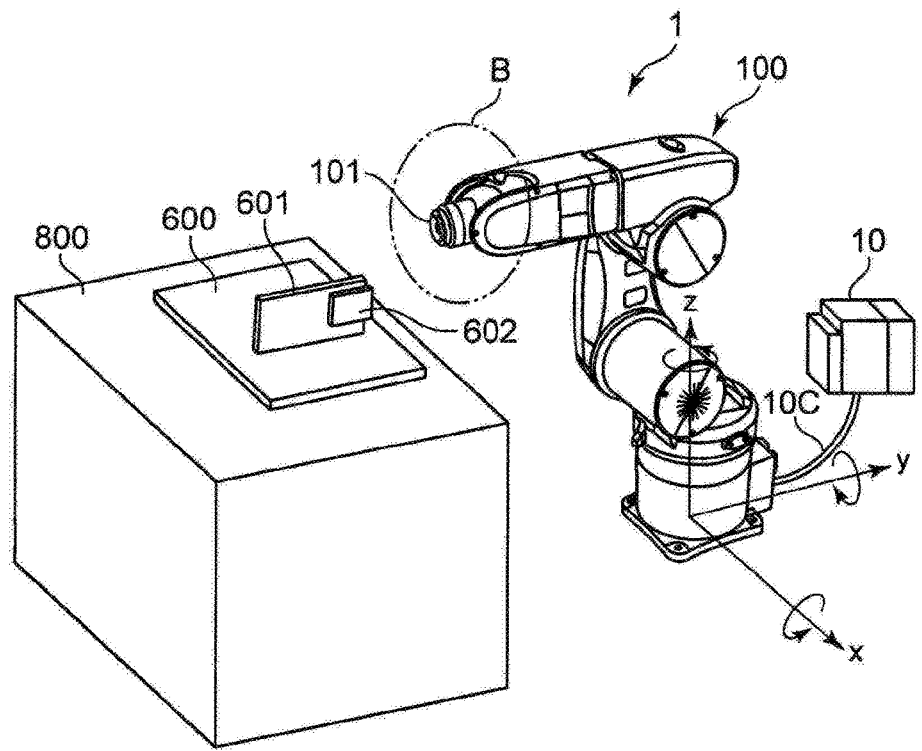
FIG. 1A is a perspective view schematically showing an external appearance of a component insertion device of one embodiment of the present disclosure.

The component insertion device of the disclosure is a component insertion device by which a receiving portion having a slot or a hole of a certain shape is inserted with a specific part of a workpiece component that has a shape fitting the slot or the hole, the component insertion device comprising:

a robot; and
a control portion that controls the operation of the robot; wherein
the robot comprises:
a gripper capable of gripping the workpiece component in a state that the specific part protrudes outward;
a dummy component that is mounted protruding outward on a location in the gripper and away from the gripped workpiece component, has a corresponding part with the same shape as the shape of the specific part of the workpiece component and exhibits rigidity; and
a force sensor capable of detecting, through the gripper, a contact reaction force received by the dummy component from the surrounding of the slot or the hole of the receiving portion; and the control portion comprises:
a first insertion processing portion that performs, in a state that the receiving portion is arranged in a movable range of the robot, a processing in which the corresponding part of the dummy component is inserted into the slot or the hole of the receiving portion by the robot through compliance control which is based on output of the force sensor;
a recognition processing portion that performs, in a state that the corresponding part of the dummy component is inserted into the slot or the hole of the receiving portion, a processing in which a position and a posture of the slot or the hole which use the robot as a reference are recognized; and
a second insertion processing portion that performs, in a state of maintaining the arrangement of the receiving portion, a processing in which the outwardly protruding specific part of the workpiece component gripped in the gripper is inserted into the slot or the hole of the receiving portion based on the position and the posture of the slot or the hole which use the robot as a reference by the robot through position control.

In the specification, the "specific part" of the workpiece component corresponds to the part inserted into the slot or the hole. Therefore, it is sufficient that the "specific part" has a shape fitting the slot or the hole. The "specific part" is not limited to an end portion and may refer to other portions.

Besides, the "rigidity" exhibited by the dummy component does not means complete rigidity and may be substantial rigidity that enables compliance control which is based on the output of the force sensor.

Besides, in fact, the specific part of the workpiece component is a target which is more flexible than the dummy component. The reason is that if the specific part of the workpiece component has the same rigidity as the dummy component, there is no necessity to perform the processing of using the dummy component to recognize the position of the slot or the hole in advance, and the specific part of the workpiece component may be directly inserted into the slot or the hole of the receiving portion through compliance control.

In the component insertion device of the disclosure, the gripper of the robot grips the workpiece component in the state that the specific part protrudes outward (outside the gripper). Besides, the dummy component is mounted on the location in the gripper and away from the gripped workpiece component and protrudes outward (outside the gripper). The first insertion processing portion of the control portion performs, in the state that the receiving portion is arranged in the movable range of the robot, the processing in which the corresponding part of the dummy component is inserted into the slot or the hole of the receiving portion by the robot through the compliance control which is based on the output of the force sensor. Although the insertion processing is performed through the compliance control, since the dummy component exhibits rigidity, the insertion processing can be completed in a relatively short time (for example, about 15 seconds). Next, in the state that the corresponding part of the dummy component is inserted into the slot or the hole of the receiving portion, the recognition processing portion performs the processing in which the position and the posture of the slot or the hole which use the robot as the reference are recognized. The recognition processing takes hardly any time (for example, less than one second). Next, the second insertion processing portion performs, in the state of maintaining the arrangement of the receiving portion (at least after the recognition processing), the processing in which the specific part of the workpiece component gripped in the gripper is inserted into the slot or the hole of the receiving portion by the robot through position control based on the position and the posture of the slot or the hole which use the robot as the reference. Because the accurate position and posture of the slot or the hole which use the robot as the reference is already recognized, the insertion processing can be completed in a relatively short time (for example, about five seconds) and is performed at a high accuracy. Therefore, the specific part of the workpiece component may be more flexible than the dummy component. Therefore, according to the component insertion device, the receiving portion having a slot or a hole of a certain shape can be automatically inserted with the relatively flexible workpiece component that has a shape fitting the slot or the hole in a short time.

In the component insertion device of one embodiment, the location in the gripper where the dummy component is mounted is set in a manner that the dummy component is separated from the receiving portion and/or members around the receiving portion during the processing of inserting the specific part of the workpiece component into the slot or the hole of the receiving portion.

In the component insertion device of this embodiment, during the processing of inserting the specific part of the workpiece component into the slot or the hole of the receiving portion, the dummy component can be smoothly inserted without interfering with the receiving portion and/or the members around the receiving portion.

In the component insertion device of one embodiment, the specific part of the workpiece component gripped by the gripper and the corresponding part of the dummy component mounted on the gripper protrude toward the same direction in a mutually parallel manner.

In the component insertion device of this embodiment, during the processing of inserting the specific part of the workpiece component into the slot or the hole of the receiving portion, the gripper may move in parallel without the necessity of substantially changing the posture.

The component insertion method of the disclosure is a component insertion method in which a receiving portion having a slot or a hole of a certain shape is inserted with a specific part of a workpiece component that has a shape fitting the slot or the hole by the aforementioned component insertion device, wherein in a state that the receiving portion is arranged in a movable range of the robot, the gripper of the robot grips the workpiece component in the state that the specific part protrudes outward, and the dummy component is mounted on the location in the gripper and away from the gripped workpiece component and protrudes outward, a processing is performed in which the corresponding part of the dummy component is inserted into the slot or the hole of the receiving portion by the robot through compliance control which is based on the output of the force sensor, in a state that the corresponding part of the dummy component is inserted into the slot or the hole of the receiving portion, a processing is performed in which the position and the posture of the slot or the hole which use the robot as a reference are recognized, and after that, in a state of maintaining the arrangement of the receiving portion, a processing is performed in which the outwardly protruding specific part of the workpiece component gripped in the gripper is inserted into the slot or the hole of the receiving portion by the robot through position control based on the position and the posture of the slot or the hole which use the robot as the reference.

According to the component insertion method of the disclosure, the receiving portion having the slot or the hole of a certain shape can be automatically inserted with the relatively flexible workpiece component that has a shape fitting the slot or the hole in a short time.

The program of the disclosure is a program for making a computer execute the component insertion method.

By making the computer execute the program of the disclosure, the aforementioned component insertion method can be implemented.

As seen from the above, according to the component insertion device and the component insertion method of the disclosure, the receiving portion having the slot or the hole of a certain shape can be automatically inserted with the relatively flexible workpiece component that has a shape fitting the slot or the hole in a short time. Besides, by making the computer execute the program of the disclosure, the component insertion method can be implemented.

Embodiments of the present disclosure are described below in detail with reference to the diagrams.

FIG. 1A schematically shows an external appearance of a component insertion device 1 of one embodiment of the present disclosure. In this example, the component insertion device 1 includes a robot 100 that is arranged near an assembly table 800 and a controller 10 that controls the movement of the robot 100.

Figure 1B:
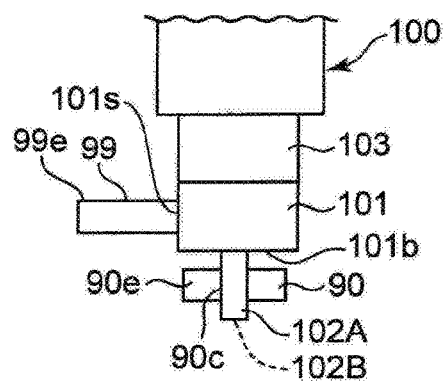
FIG. 1B is a diagram showing the vicinity of a gripper of a robot constituting the component insertion device when viewed laterally.
Figure 1C:
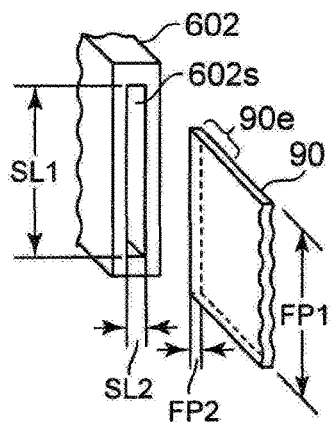
FIG. 1C is a diagram showing a FPC connector that has a slender straight-shaped slot and a FPC that has a plate-like shape fitting the slot.

In this example, the assembly table 800 is arranged in a movable range of the robot 100. An in-process product 600, on which a circuit board 601 which has a FPC (Flexible Printed Circuit; flexible wiring board) connector 602 serving as a receiving portion is mounted, is placed on the assembly table 800 (the in-process product 600 may be fixed on the assembly table 800 by an unillustrated element). As shown in FIG. 1C, the FPC connector 602 has a slender straight-shaped slot 602s. The component insertion device 1 is a device used to automatically insert an end portion 90e serving as a specific part of a rectangular plate-like FPC 90 serving as a workpiece component into the slot 602s of the FPC connector 602. A longitudinal dimension SL1 and a lateral dimension SL2 of an opening of the slot 602s are respectively larger than a longitudinal dimension FP1 (3 cm in this example) and a lateral dimension FP2 (0.20 mm in this example) of the end portion 90e of the FPC 90 by a fixed clearance dimension, and are set to SL1=3.2 cm and SL2=2 mm in this example. A depth of the slot 602s (that is, an insertion depth of the FPC 90) is set to 5 mm in this example.

Moreover, the lateral dimension SL2 of the slot 602s may gradually become smaller (narrower) as the depth in the slot 602s increases.

In this example, the robot 100 is made of a 6-axis (6 control axes) articulated robot having a gripper 101. The robot 100 has three axes which show a translation freedom degree, namely x (position in x axis), y (position in y axis) and z (position in z axis), and three axes which show a rotation freedom degree, namely yaw (yaw angle), pitch (pitch angle) and roll (roll angle). FIG. 1B shows the vicinity (a part surrounded by a two-dot chain line B) of the gripper 101 in FIG. 1A. As shown in FIG. 1B, in this example, the gripper 101 has a pair of claws 102A, 102B capable of clamping the FPC 90. The pair of claws 102A, 102B protrudes outward in a slender shape from a front end surface 101b of the gripper 101. Moreover, in FIG. 1B, the claw 102B is hidden and arranged behind the claw 102A. When the claws 102A, 102B of the gripper 101 grip the FPC 90 in a central portion 90c of the FPC 90, a state in which the end portion 90e of the FPC 90 protrudes outward is reached.

In this example, as for dimensions of the rectangular plate-like FPC 90, a total length is set to 7 cm, a width is set to 3 cm(=FP1) and a thickness is set to 0.20 mm(=FP2). In a state that the central portion 90c of the FPC 90 is gripped by the claws 102A, 102B of the gripper 101, a state in which the end portion 90e of the FPC 90 protrudes toward the outside (the lateral side in this example) of the claws 102A, 102B of the gripper 101 by about 3 cm is reached.

The FPC 90 is a publicly known FPC and is formed by arranging a conductive foil (such as a copper foil) on a relatively flexible substrate like polyimide and so on via an adhesion layer (for example, an epoxy thermosetting adhesive).

At a location 101s which is on a side surface of the gripper 101 and away from the gripped FPC 90, a plate member 99 serving as a dummy component which has a rectangular plate-like shape and exhibits rigidity is mounted and protrudes outward (outside the gripper 101). The shape of an end portion 99e of the plate member 99 serving as a corresponding part is set to be the same as the shape of the end portion 90e of the FPC 90. The location 101s which is on the side surface of the gripper 101 and where the plate member 99 is mounted is set in a manner that the plate member 99 does not interfere with the FPC connector 602 and the circuit board 601 and the like around the FPC connector 602 (away from these members) during the processing (step S3 in FIG. 3) described later. Besides, the end portion 99e of the plate member 99 and the end portion 90e of the FPC 90 protrude toward the same direction from the gripper 101 in a mutually parallel manner (that is, the relative angle is zero).

In this example, as for the dimensions of the rectangular plate-like plate member 99, a protruding dimension from the side surface of the gripper 101 is set to about 3 cm-6 cm, the width is set to 3 cm and the thickness is set to 0.20 mm.

The "rigidity" exhibited by the plate member 99 does not means complete rigidity and may be substantial rigidity that enables compliance control which is based on the output of a force sensor 103 described later. Therefore, in addition to metal materials such as stainless steel, iron and the like, relatively hard plastic materials such as polycarbonate (PC) and the like can be used as the material of the plate member 99.

Besides, the force sensor 103 is mounted at a location near the gripper 101 of the robot 100. The force sensor 103 can detect, from the surrounding of the slot 602s of the FPC connector 602, a contact reaction force received by the plate member 99 via the gripper 101 during the processing (step S1 in FIG. 3) described later.

Figure 2:
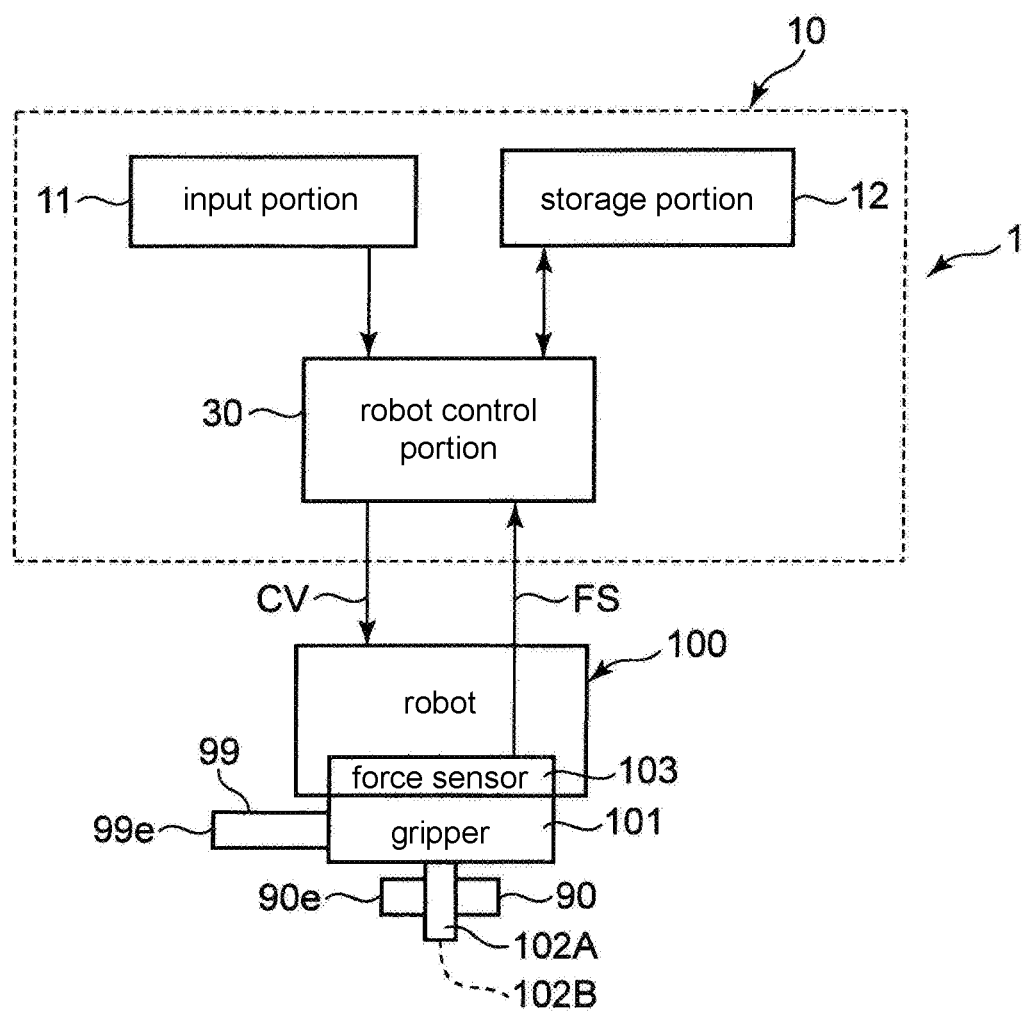
FIG. 2 is a diagram showing a block constitution of a control system of the component insertion device.

As shown in FIG. 2, in this example, the controller 10 includes an input portion 11, a storage portion 12, and a robot control portion 30.

In this example, the input portion 11 consists of a teaching pendant. In this example, the input portion 11 is used especially for a user to input a processing start command.

In this example, the storage portion 12 consists of a nonvolatile semiconductor memory. In this example, the storage portion 12 stores the position and the posture of the slot 602s which use the robot 100 as a reference especially during the processing (step S2 in FIG. 3) described later.

In this example, the robot control portion 30 is formed by a processor that operates according to a robot control program stored in the storage portion 12. The robot control portion 30 controls the 6-axis robot 100 using control information CV consisting of six elements which have the same number as the axis number of the 6-axis robot 100. The control information CV includes three elements which show the translation freedom degree, namely x (position of x axis), y (position of y axis) and z (position of z axis), and three elements which show the rotation freedom degree, namely yaw (value of yaw angle), pitch (value of pitch angle) and roll (value of roll angle). In a common position control, the value of each element of the control information CV is sequentially updated at a fixed cycle, and each axis of the robot 100 is driven accordingly.

Besides, in this example, the robot control portion 30 can receive an output signal FS of the force sensor 103 and perform compliance control (control which uses the position and the posture of the front end of the robot and the force applied to the front end of the robot to make the robot move gently) on the robot 100. In the compliance control, for example, the movement of the robot 100 is feedback controlled in a manner that the force component in a direction (x direction and z direction) that intersects (orthogonal to) the insertion direction (for example, −y direction) detected in the force sensor 103 decreases.

The transmission and reception of the control information CV and the output signal FS of the force sensor 103 between the controller 10 and the robot 100 is performed via a cable 10C shown in FIG. 1A.

Figure 3:
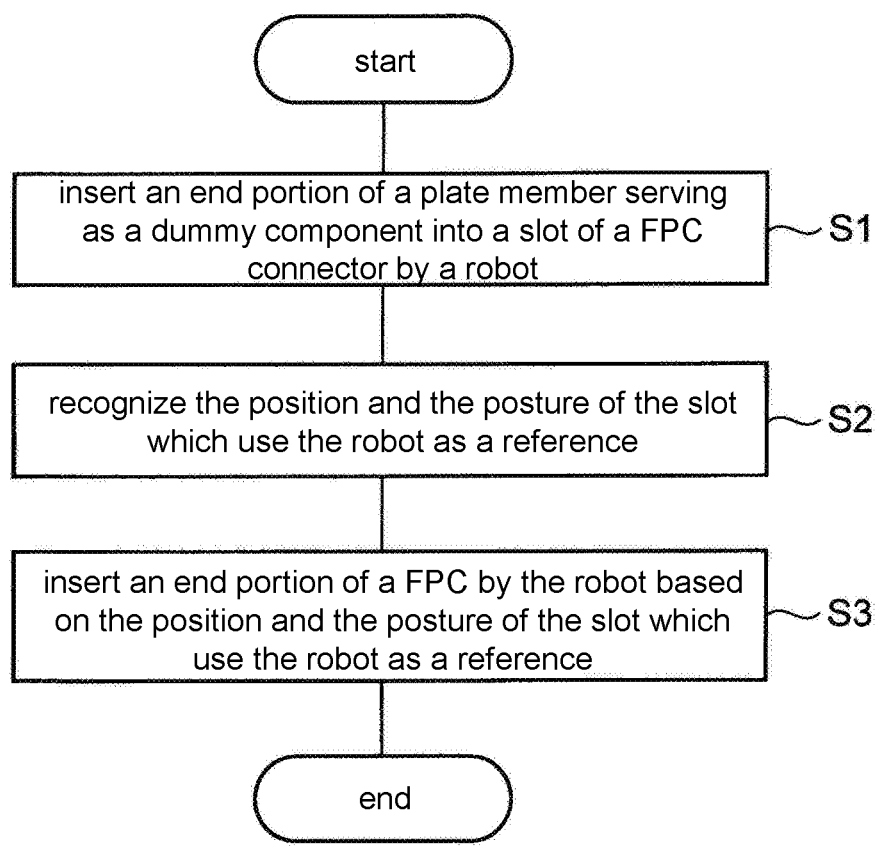
FIG. 3 is a diagram showing a flow of a processing in which an end portion of the FPC is automatically inserted into the slot of the FPC connector by the component insertion device.

FIG. 3 shows an operation flow of a component insertion method of one embodiment performed by the component insertion device 1 described above. Next, a processing of automatically inserting the end portion 90e of the FPC 90 into the slot 602s of the FPC connector 602 is described with reference to FIG. 4A-FIG. 4E (viewed from the +x direction in FIG. 1A) together.

Figure 4A:
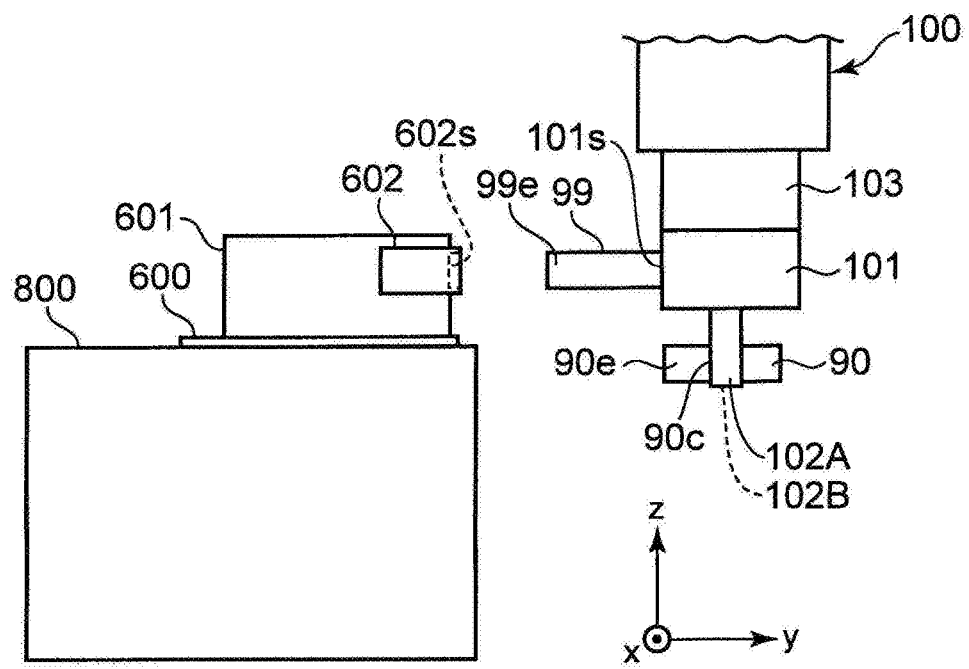
FIG. 4A is a diagram schematically showing a process of automatically inserting the end portion of the FPC into the slot of the FPC connector.

As shown in FIG. 4A, the in-process product 600 containing the FPC connector 602 is placed on the assembly table 800 in advance. Besides, the pair of the claws 102A, 102B of the gripper 101 of the robot 100 grips the central portion 90c of the FPC 90 in the state that the end portion 90e protrudes outward. Besides, the plate member 99 is mounted on the location 101s which is on the side surface of the gripper 101 and away from the gripped FPC 90 and protrudes outward. In the state of FIG. 4A, the end portion 99e of the plate member 99 and the end portion 90e of the FPC 90 face the same direction (−y direction which uses the robot 100 as a reference) in a mutually parallel manner.

Figure 4B:
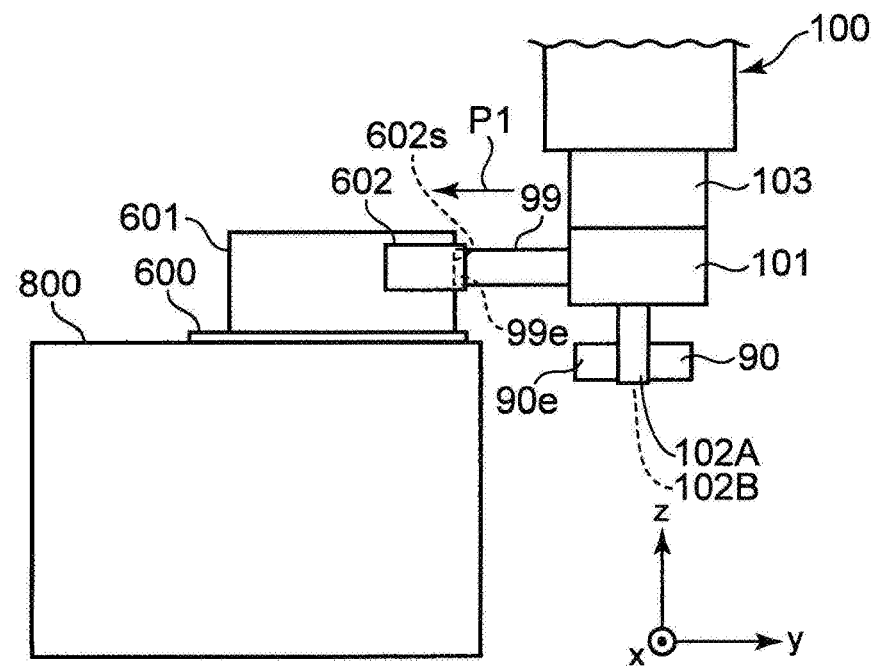
FIG. 4B is a diagram schematically showing a process of automatically inserting the end portion of the FPC into the slot of the FPC connector.

When the user inputs the processing start command by the input portion 11, first, as shown in step S1 in FIG. 3, the robot control portion 30 of the controller 10 operates as a first insertion processing portion, and performs the processing in which the end portion 99e of the plate member 99 serving as the dummy component is inserted into the slot 602s of the FPC connector 602 by the robot 100 through compliance control which is based on the output of the force sensor 103. Although the insertion processing (step S1 in FIG. 3) is performed through compliance control, since the plate member 99 exhibits rigidity, the insertion processing can be completed in a relatively short time (for example, about 15 seconds). Accordingly, as shown in FIG. 4B by an arrow P1, the end portion 99e of the plate member 99 is inserted into the slot 602s of the FPC connector 602.

Here, the processing of inserting through the compliance control starts from the state of FIG. 5A and is performed in the following sequence. First, as shown in FIG. 5B by an arrow Q1, the end portion 99e of the plate member 99 is butted against the surrounding of the slot 602s of the FPC connector 602 (near the opening) (butting operation). Next, as shown in FIG. 5C by an arrow Q2, the position of the opening of the slot 602s is searched by the end portion 99e of the plate member 99 (searching operation). Once the position of the opening of the slot 602s is found, as shown in FIG. 5D by an arrow Q3, the end portion 99e of the plate member 99 is pushed into the vicinity of the entrance of the slot 602s of the FPC connector 602 (pushing operation). During the pushing, as shown in FIG. 5E by a mark Q4, the end portion 99e of the plate member 99 is slightly vibrated to eliminate the engagement (a phenomenon of being caught at the entrance of the slot 602s) (engagement elimination operation). In this way, as shown in FIG. 5F, the end portion 99e of the plate member 99 is inserted into the slot 602s of the FPC connector 602.

Figure 4C:
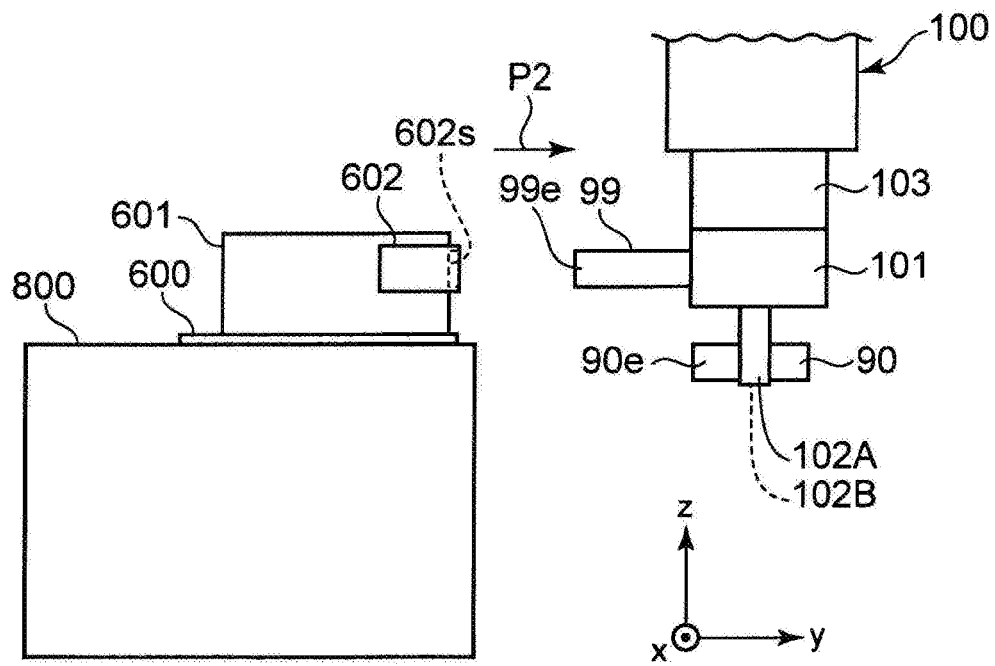
FIG. 4C is a diagram schematically showing a process of automatically inserting the end portion of the FPC into the slot of the FPC connector.

Next, in the state that the end portion 99e of the plate member 99 is inserted into the slot 602s of the FPC connector 602, as shown in step S2 in FIG. 3, the robot control portion 30 operates as a recognition processing portion and performs a processing of recognizing the position and the posture (x, y, z, yaw, pitch, roll) of the slot 602s which use the robot 100 as a reference. The recognition processing (step S2 in FIG. 3) takes hardly any time (for example, less than one second). The recognized position and posture of the slot 602s which use the robot 100 as a reference are stored in the storage portion 12. After that, as shown in FIG. 4C by an arrow P2, the robot 100 is temporarily retracted in a direction (+y direction) away from the assembly table 800. Accordingly, the end portion 99e of the plate member 99 is drawn out from the slot 602s of the FPC connector 602.

Figure 4D:
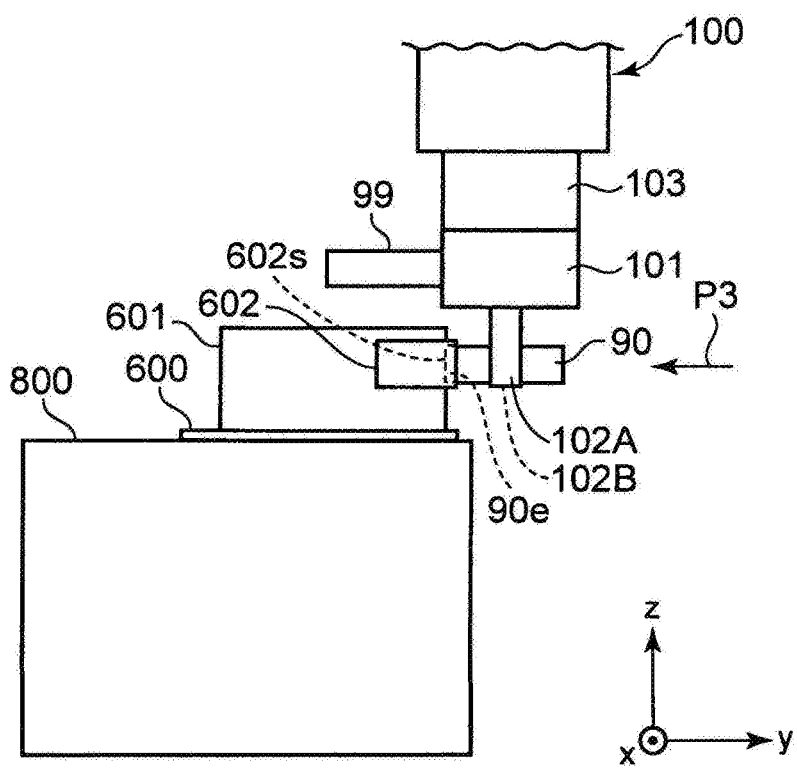
FIG. 4D is a diagram schematically showing a process of automatically inserting the end portion of the FPC into the slot of the FPC connector.

Next, in this example, in the state of maintaining the arrangement of the FPC connector 602 after step S1 in FIG. 3, as shown in step S3 in FIG. 3, the robot control portion 30 operates as a second insertion processing portion and performs the processing in which the end portion 90e of the FPC 90 gripped in the gripper 101 is inserted, as shown in FIG. 4D by an arrow P3, into the slot 602s of the FPC connector 602 by the robot 100 through position control based on the position and the posture (x, y, z, yaw, pitch, roll) of the slot 602s which use the robot 100 as a reference.

Since the accurate position and posture (x, y, z, yaw, pitch, roll) of the slot 602s which use the robot 100 as a reference are already recognized, the insertion processing (step S3 in FIG. 3) can be completed in a relatively short time (for example, about five seconds) and is performed at a high accuracy. Therefore, the end portion 90e of the FPC 90 may also be more flexible than the plate member 99 as in this example. Therefore, according to the component insertion device 1, the relatively flexible end portion 90e of the FPC 90 can be automatically inserted into the FPC connector 602 having the slot 602s at a short time of about 20 seconds in total.

In particular, the end portion 99e of the plate member 99 and the end portion 90e of the FPC 90 protrude toward the same direction from the gripper 101 in a mutually parallel manner. Therefore, during the insertion processing (step S3 in FIG. 3), the gripper 101 may move in parallel without the necessity of substantially changing the posture.

Specifically, this insertion processing (step S3 in FIG. 3) is performed in a sequence corresponding to FIG. 5A→FIG. 5B→FIG. 5D→FIG. 5F in FIG. 5. That is, the searching operation in FIG. 5C and the pushing elimination operation in FIG. 5E are omitted.

The location 101s which is in the gripper 101 and where the plate member 99 is mounted is set so as to be separated from the FPC connector 602 and the surrounding circuit board 601 and the like during the processing of inserting the end portion 90e of the FPC 90 into the slot 602s of the FPC connector 602 (step S3 in FIG. 3). Therefore, during the processing of inserting the end portion 90e of the FPC 90, the plate member 99 does not interfere with the FPC connector 602 and the surrounding circuit board 601 and the like, and the end portion 90e of the FPC 90 can be inserted smoothly.

Figure 4E:
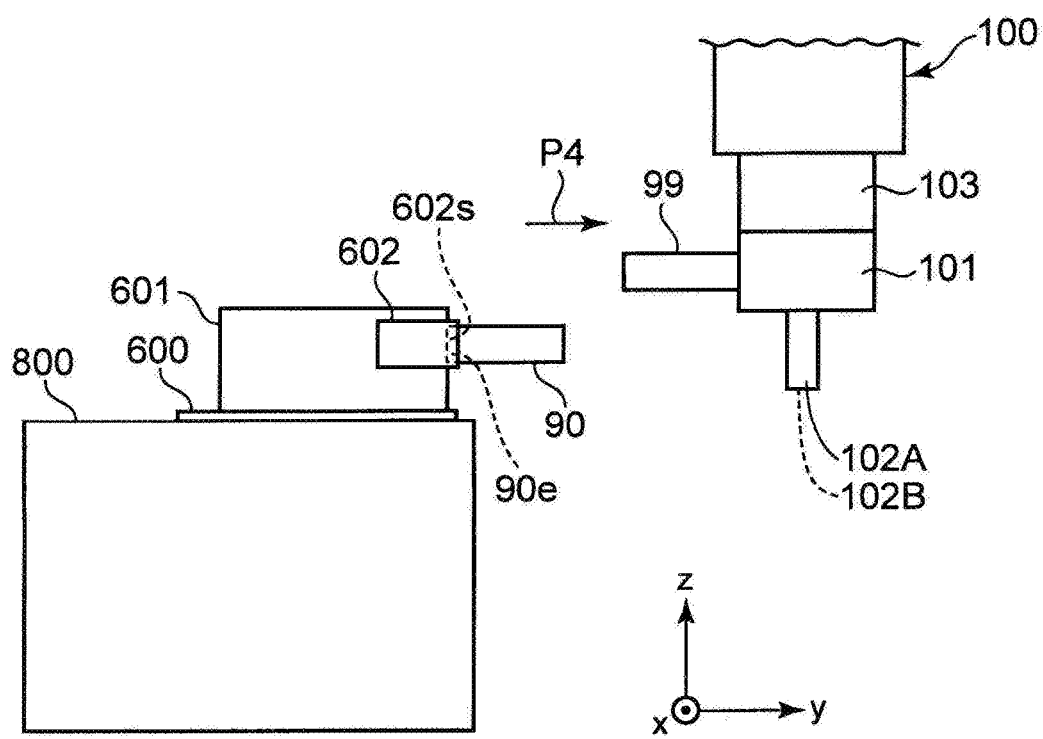
FIG. 4E is a diagram schematically showing a process of automatically inserting the end portion of the FPC into the slot of the FPC connector.

After that, the pair of claws 102A, 102B of the gripper 101 of the robot 100 opens and releases the FPC 90. Then, as shown in FIG. 4E by an arrow P4, the robot 100 is retracted in a direction (+y direction) away from the assembly table 800.

Figure 7A:
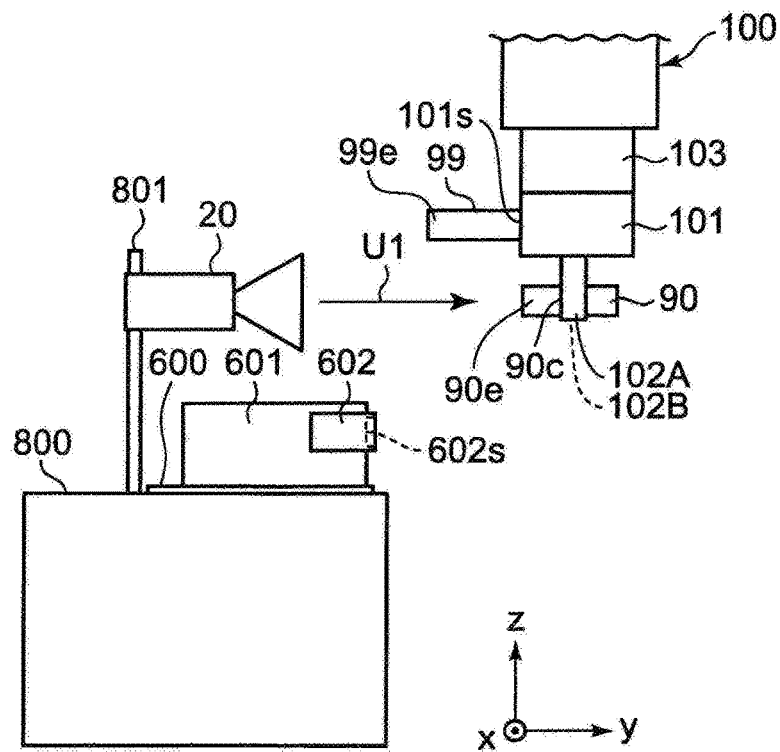
FIG. 7A is a diagram describing an example in which a camera serving as an imaging device is arranged and a gripping position or posture of the FPC is gotten based on images taken by the camera.

When the robot 100 uses the gripper 101 to grip the FPC 90 which is a workpiece component, the claws 102A, 102B of the gripper 101 may grip the FPC 90 in a state of deviating from the position where the FPC 90 should be gripped (the original position where the FPC 90 should be gripped, the central portion 90c in the above example) or the posture (the posture that the end portion 99e faces the −y direction in the above example) which is the reference for gripping. In order to successfully insert the FPC 90 even in this case, it is desirable that, as shown in FIG. 7A for example, a camera 20 is arranged as an imaging device and the gripping position or posture of the FPC 90 is taken by the camera 20. In the example of FIG. 7A, the camera 20 is held above the FPC connector 602 by a stand 801 in a posture that the view field faces the robot 100 as shown by an arrow U1. In this case, before the processing (step S3 in FIG. 3) in which the end portion 90e of the FPC 90 is inserted into the slot 602s in the state that the claws 102A, 102B of the gripper 101 grip the FPC 90 (or even before the processing of inserting the end portion 99e of the plate member 99 (step S1 in FIG. 3)), the robot control portion 30 moves the FPC 90 by the robot 100 for a plurality of times in front of the camera 20 and takes a plurality of images by the camera 20 from mutually different angles. Then, the robot control portion 30 gets the deviation of the gripping position or posture of the FPC 90 (deviation from the reference position or posture, the same applies hereinafter) based on the plurality of images, and corrects the deviation of the gripping position or posture of the FPC 90 on data. In addition, the robot control portion 30 operates as the second insertion processing portion and performs the processing in which the end portion 90e of the FPC 90 gripped in the gripper 101 is inserted into the slot 602s of the FPC connector 602 through position control (step S3 in FIG. 3). In this case, even when the FPC 90 is gripped in the state of deviating from the reference position or posture, the end portion 90e of the FPC 90 can be smoothly inserted into the slot 602s of the FPC connector 602. Besides, similarly, even when there is individual difference such as dimension variation and the like in the FPC 90, the end portion 90e of the FPC 90 can be smoothly inserted into the slot 602s of the FPC connector 602.

Figure 7B:
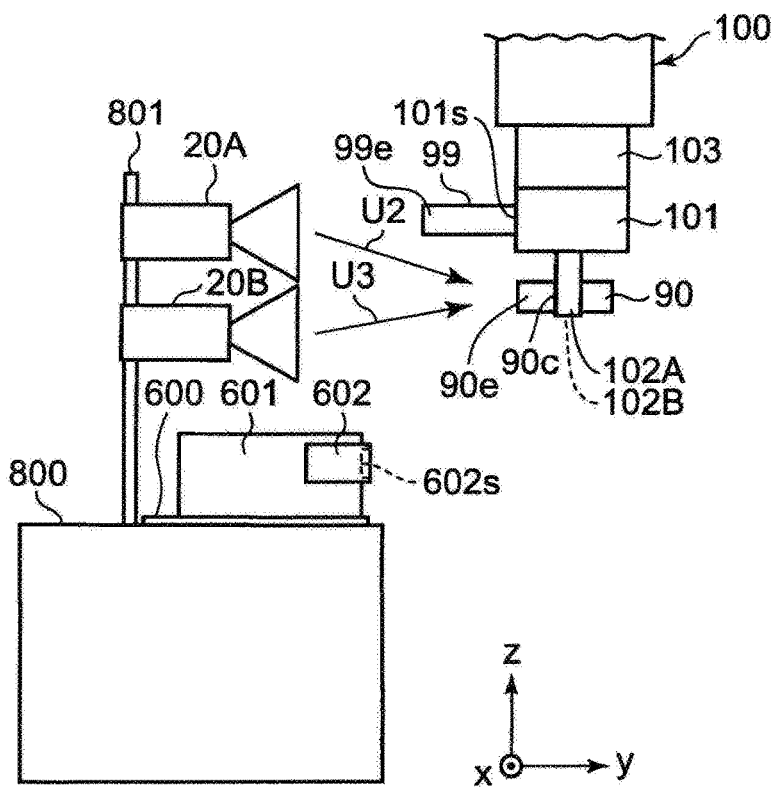
FIG. 7B is a diagram describing an example in which a stereo camera is arranged and the gripping position or posture of the FPC is gotten based on images taken by the stereo camera.

Moreover, as shown in FIG. 7B, it may be that stereo cameras (spatially separated cameras) 20A, 20B are used as imaging devices to image the FPC 90 simultaneously from mutually different angles as shown by arrows U2 and U3, and the deviation of the gripping position or posture of the FPC 90 and/or the individual difference such as the dimension variation and the like of the FPC 90 are/is gotten based on the images. Accordingly, imaging times can be reduced and the processing time can be shortened. Besides, moreover, in FIG. 7B, the stereo cameras 20A, 20B are illustrated in an up-and-down arrangement, and it is evident that the stereo cameras 20A, 20B may also be arranged left and right.

Figure 6:
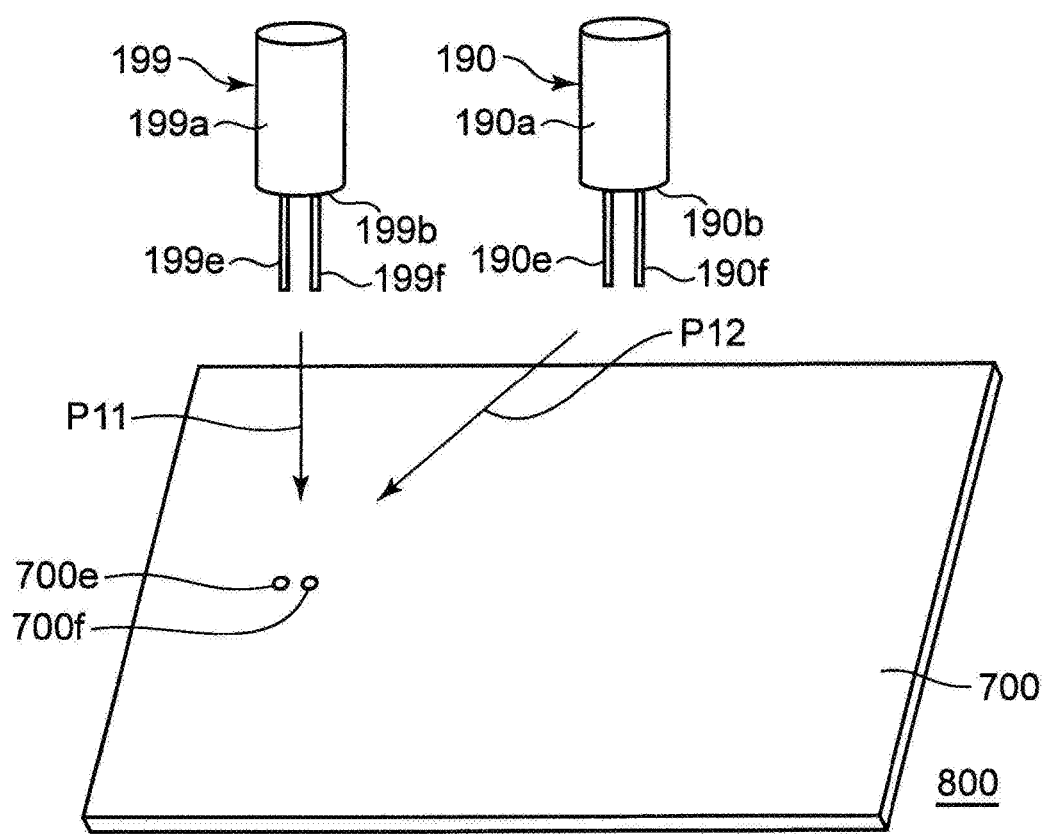
FIG. 6 is a diagram showing an example in which lead pins of electrolytic capacitors are inserted into small holes of a circuit board.

In the above example, the case is described in which the end portion 90e of the FPC 90 which has a plate-like shape and serves as the workpiece component is inserted into the FPC connector 602 which serves as the receiving portion having the slender straight-shaped slot 602s. However, the disclosure is not limited hereto. The present disclosure is also applied to the case in which, as shown in FIG. 6 for example, lead pins 190e, 190f of an electrolytic capacitor 190 which serves as the workpiece component is inserted into a circuit board 700 (mounted on the assembly table 800, or may be fixed on the assembly table 800) which serves as the receiving portion having a pair of circular small holes 700e, 700f. The electrolytic capacitor 190 has a cylindrical main portion 190a, and a pair of lead pins 190e, 190f serving as the specific part that protrudes in a slender shape from an end surface 190b of the main portion 190a. Here, the lead pins 190e, 190f have circular cross sections which fit the small holes 700e, 700f respectively, and a distance between centers of the lead pins 190e, 190f corresponds with the distance between centers of the small holes 700e, 700f. The material of the lead pins 190e, 190f is the material obtained by plating tin and copper on a copper core and is relatively flexible. In this case, a dummy component 199 that has entirely the same shape as that of the electrolytic capacitor 190 is prepared. The dummy component 199 has a cylindrical main portion 199a, and a pair of dummy pins 199e, 199f serving as the corresponding part that protrudes in a slender shape from an end surface 199b of the main portion 199a. The dummy pins 199e, 199f consist of, for example, stainless steel that exhibits rigidity. Besides, in step S1 in FIG. 3, the robot control portion 30 of the controller 10 operates as the first insertion processing portion and performs the processing in which, as shown in FIG. 6 by an arrow P11, the dummy pins 199e, 199f of the dummy component 199 are inserted into the small holes 700e, 700f of the circuit board 700 by the robot 100 through the compliance control which is based on the output of the force sensor 103. Next, in step S2 in FIG. 3, the robot control portion 30 operates as the recognition processing portion and performs the processing of recognizing the position and the posture (x, y, z, yaw, pitch, roll) of the small holes 700e, 700f which use the robot 100 as the reference. Next, in step S3 in FIG. 3, the robot control portion 30 operates as the second insertion processing portion and performs the processing in which, as shown in FIG. 6 by an arrow P12, based on the position and the posture (x, y, z, yaw, pitch, roll) of the small holes 700e, 700f which use the robot 100 as the reference, the lead pins 190e, 190f of the electrolytic capacitor 190 are inserted into the small holes 700e, 700f of the circuit board 700 by the robot 100 through the position control. In this way, the pair of the lead pins 190e, 190f of the electrolytic capacitor 190 can be automatically inserted into the pair of small holes 700e, 700f of the circuit board 700 in a short time.

Moreover, when plural pairs of small holes 700e, 700f; 700e, 700f and so on of the circuit board 700 are arranged, the lead pins 190e, 190f of the electrolytic capacitor 190 can be sequentially inserted into each pair of small holes 700e, 700f by the same sequence as mentioned above (or may be inserted concurrently by a plurality of robots). Accordingly, a plurality of electrolytic capacitors 190 can be automatically mounted on the circuit board 700.

In the example described above, the receiving portion having a slot or a hole (the FPC connector 602 contained in the in-process product 600, the circuit board 700) is placed on the assembly table 800, but the disclosure is not limited hereto. The receiving portion having a slot or a hole may be conveyed to the movable range of the robot 100 by, for example, a belt conveyor to maintain the arrangement relative to the robot 100 between the aforementioned processing (steps S1-S3 in FIG. 3).

Besides, the combination of the receiving portion which has a slot or a hole of a certain shape and the workpiece component which has a shape fitting the slot or the hole is not limited to the aforementioned two examples of combination and there may be various combinations.

The robot control portion 30 of the controller 10 is formed by a processor that operates in accordance with a program. Besides, the storage portion 12 is formed by a storage device such as a nonvolatile semiconductor memory and the like. That is, the robot control portion 30 and the storage portion 12 may be substantially formed by a computer device (for example, a programmable logic controller (PLC) and the like). Therefore, the component insertion method described by FIG. 3 is desirably formed as programs for the computer to execute. Besides, the programs are desirably stored in a computer readable non-transitory storage device. In that case, the aforementioned component insertion method can be implemented by making the computer device read and execute the programs stored in the storage device.

The aforementioned embodiments are illustrative and various changes can be made without departing from the scope of the present disclosure. Each of the aforementioned plural embodiments is tenable individually and the embodiments can be combined with one another. Besides, each of the various features in different embodiments is also tenable individually and the features in different embodiments can be combined with one another.

What is claimed is:

1. A component insertion device, by which a receiving portion having a slot or a hole is inserted with a specific part of a workpiece component that has a shape fitting the slot or the hole, the component insertion device comprising:
   a robot; and
   a control portion that controls the operation of the robot; wherein
   the robot comprises:
   a gripper configured for gripping the workpiece component in a state that the specific part protrudes outward;
   a dummy component that is mounted protruding outward on a location in the gripper, the location being away from the gripped workpiece component, wherein the dummy component has a corresponding part with the same shape as the shape of the specific part of the workpiece component and exhibits rigidity; and
   a force sensor configured for detecting, through the gripper, a contact reaction force received by the dummy component from the surrounding of the slot or the hole of the receiving portion; and the control portion comprises:

a first insertion processing portion configured to perform, in a state that the receiving portion is arranged in a movable range of the robot, a processing in which the corresponding part of the dummy component is capable of being inserted into the slot or the hole of the receiving portion by the robot through compliance control of the robot, wherein the compliance control is based on output of the force sensor and uses a position and a posture of a front end of the robot and a force applied to the front end of the robot to make the robot move gently;

a recognition processing portion configured to perform, in a state that the corresponding part of the dummy component is inserted into the slot or the hole of the receiving portion, a processing in which a position and a posture of the slot or the hole are recognized by using a position and a posture of the robot as a reference; and a second insertion processing portion configured to perform, in a state of maintaining the arrangement of the receiving portion, a processing in which the outwardly protruding specific part of the workpiece component gripped in the gripper is inserted into the slot or the hole of the receiving portion based on the position and the posture of the slot or the hole by the robot through position control.

2. The component insertion device according to claim 1, wherein the location in the gripper where the dummy component is mounted is set in a manner that the dummy component is separated from the receiving portion as the specific part of the workpiece component is being inserted into the slot or the hole of the receiving portion by the robot.

3. The component insertion device according to claim 2, wherein the specific part of the workpiece component gripped by the gripper and the corresponding part of the dummy component mounted on the gripper protrude from the gripper toward the same direction in a mutually parallel manner.

4. The component insertion device according to claim 1, wherein the specific part of the workpiece component gripped by the gripper and the corresponding part of the dummy component mounted on the gripper protrude from the gripper toward the same direction in a mutually parallel manner.

5. A component insertion method, in which a receiving portion having a slot or a hole is inserted with a specific part of a workpiece component that has a shape fitting the slot or the hole by the component insertion device according to claim 1, wherein in a state that the receiving portion is arranged in a movable range of the robot, the gripper of the robot grips the workpiece component in the state that the specific part protrudes outward, and the dummy component is mounted on the location in the gripper, the location being away from the gripped workpiece component, and protrudes outward, a processing is performed in which the corresponding part of the dummy component is capable of being inserted into the slot or the hole of the receiving portion by the robot through compliance control of the robot, wherein the compliance control is based on the output of the force sensor and uses a position and a posture of the front end of the robot and a force applied to the front end of the robot to make the robot move gently, in a state that the corresponding part of the dummy component is inserted into the slot or the hole of the receiving portion, a processing is performed in which the position and the posture of the slot or the hole are recognized by using a position and a posture of the robot as a reference, and after that in a state of maintaining the arrangement of the receiving portion, a processing is performed in which the outwardly protruding specific part of the workpiece component gripped in the gripper is inserted into the slot or the hole of the receiving portion by the robot through position control based on the position and the posture of the slot or the hole of as the reference.

6. The component insertion method according to claim 5, further comprising a computer-readable recording medium storing a program, wherein the program is configured to cause a computer to execute the component insertion method.

* * * * *